United States Patent
Boden

(10) Patent No.: US 8,125,024 B2
(45) Date of Patent: Feb. 28, 2012

(54) TRENCH MOSGATED DEVICE WITH DEEP TRENCH BETWEEN GATE TRENCHES

(75) Inventor: Milton J. Boden, Redondo Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 12/041,017

(22) Filed: Mar. 3, 2008

(65) Prior Publication Data

US 2008/0211016 A1  Sep. 4, 2008

Related U.S. Application Data

(60) Provisional application No. 60/892,375, filed on Mar. 1, 2007.

(51) Int. Cl.
*H01L 29/78* (2006.01)

(52) U.S. Cl. . 257/330; 257/327; 257/328; 257/E29.257; 257/331; 257/341

(58) Field of Classification Search .................. None
See application file for complete search history.

(56) References Cited

U.S. PATENT DOCUMENTS

| 4,980,747 | A | 12/1990 | Hutter et al. |
| 6,710,403 | B2 * | 3/2004 | Sapp ............................. 257/330 |
| 7,345,342 | B2 * | 3/2008 | Challa et al. .................. 257/341 |
| 2001/0015457 | A1 * | 8/2001 | Boden, Jr. ..................... 257/330 |
| 2005/0029618 | A1 | 2/2005 | Marchant |
| 2006/0214222 | A1 * | 9/2006 | Challa et al. .................. 257/328 |
| 2006/0258081 | A1 * | 11/2006 | Kocon et al. .................. 438/237 |

OTHER PUBLICATIONS

International Search Report issued Jun. 20, 2008 in corresponding PCT Application No. PCT/US08/02840.

* cited by examiner

*Primary Examiner* — N Drew Richards
*Assistant Examiner* — Mamadou Diallo
(74) *Attorney, Agent, or Firm* — Farjami & Farjami LLP

(57) ABSTRACT

A trench gated MOSFET especially for operation in high radiation environments has a deep auxiliary trench located between the gate trenches. A boron implant is formed in the walls of the deep trench (in an N channel device); a thick oxide is formed in the bottom of the trench, and boron doped polysilicon which is connected to the source electrode fills the trench. The structure has reduced capacitance and improved resistance to single event rupture and single event breakdown and improved resistance to parasitic bipolar action.

10 Claims, 1 Drawing Sheet

TRENCH MOSGATED DEVICE WITH DEEP TRENCH BETWEEN GATE TRENCHES

RELATED APPLICATIONS

This application claims the benefit of U.S. Provisional Application No. 60/892,375, filed Mar. 1, 2007, the entire disclosure of which is incorporated by reference herein.

FIELD OF THE INVENTION

This invention relates to semiconductor switching devices and more specifically relates to a trench type MOSgated device with improved switching performance and improved radiation resistance performance.

BACKGROUND OF THE INVENTION

Trench type MOSFETs and IGBTs are MOSGATED devices I which a conductive gate polysilicon is forme3d in spaced parallel trenches. Such devices and processes for their manufacture are shown in copending application Ser. No. 10/981,114, filed Nov. 4, 2004 in the names of Cao et al. entitled TRENCH POWER MOSFET WITH REDUCED GATE RESISTANCE (IR-2582), published as U.S. patent application Publication Number 2005/0112823 A1 and issued as U.S. Pat. No. 7,368,353, which is hereby incorporated in its entirety by reference. Such devices have an excellent low $R_{DSON}$, useful in switching applications.

It is desirable to further improve the switching performance of such devices by improving (reducing) the gate to drain capacitance and eliminating or reducing the possible initiation of parasitic bipolar action. It is also desirable to provide resistance to single event gate rupture and single event breakdown for devices exposed to external particle radiation as exists at high altitude or in space applications while maintaining the low conduction losses of the trench device.

BRIEF DESCRIPTION OF THE INVENTION

In accordance with the invention, a deep trench is located between the conventional gate trenches. The added deep trench is deeper than the depth of the gate trenches and may have a boron implant (in a N channel structure) in the deep trench sidewall. A thick oxide is formed in the bottom of the deep trench but is removed from the side wall. Boron doped polysilicon then fills the trench. The process employed is essentially that of above noted application Ser. No. 10/981,114, but modified by the formation of the deep trench and its P⁻ type polysilicon filler.

The thick gate oxide at the bottom of the deep trench reduces output capacitance. The sidewall implant and boron doped polysilicon shields the gates from the field created by the drain bias during operation, thus reducing the gate to drain capacitance, and eliminating or reducing parasitic bipolar action. The deep trench structure will also provide resistance to single event gate rupture and single event breakdown when operated in a radiation field as encountered, for example, at high altitude or in outer space.

DETAILED DESCRIPTION OF A PREFERRED EMBODIMENT

Figure 1:
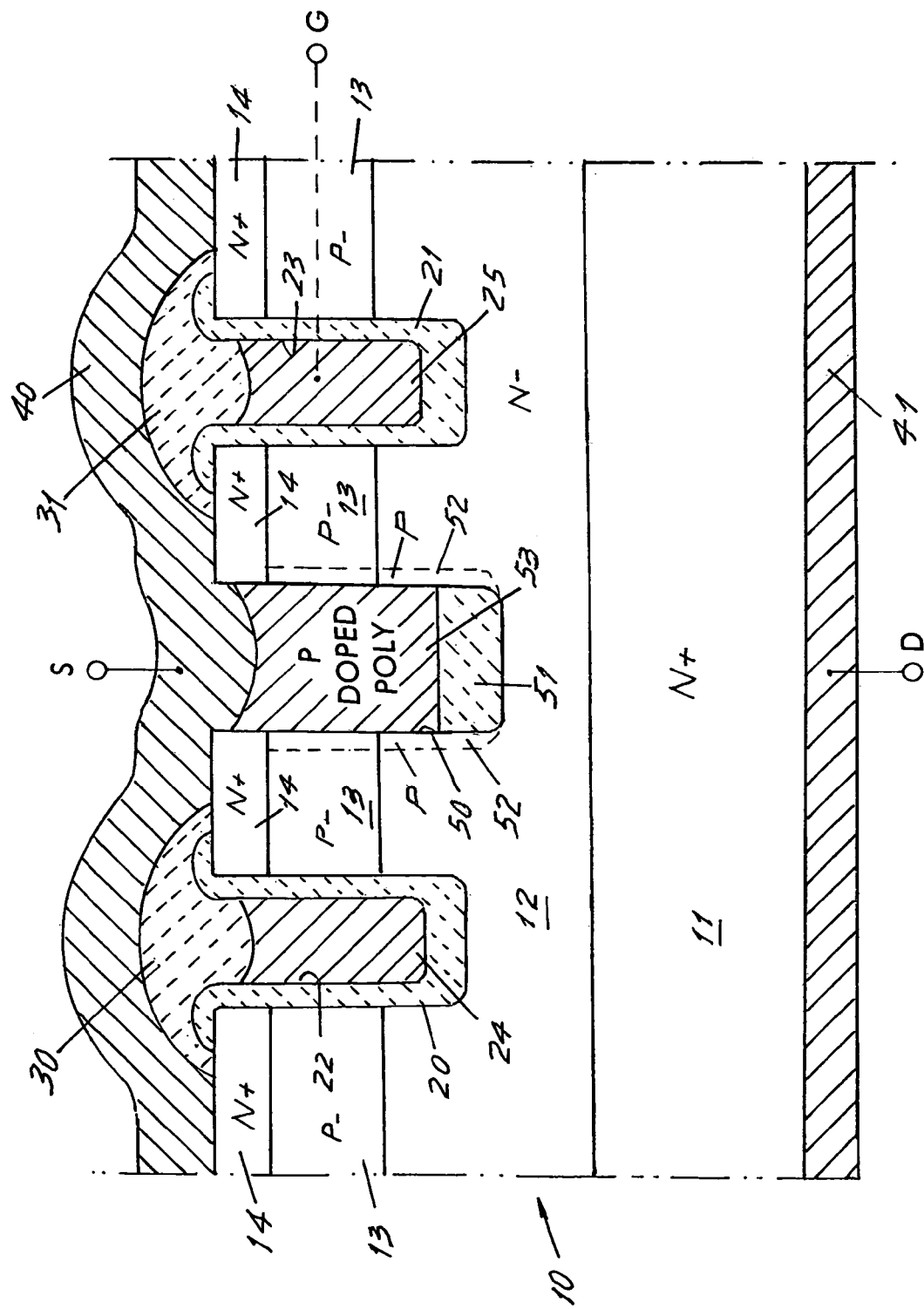
FIG. 1 is a cross section of a very small portion of a semiconductor die and shows one full "cell" of a device having plural spaced parallel cells, and incorporating the novel deep trench for each cell.

Referring to FIG. 1, there is shown a very small section of a trench type die 10 or wafer of a MOSgated device, shown as a power MOSFET. Thus, the die 10 has an N⁺ body 11 which receives an N⁻ epitaxially formed drift layer 12. If the device is to be an IGBT, an added buffer layer and P type region would be used in place of body 11.

A P⁻ channel diffusion region 13 is formed into the top of drift layer 12 and an N⁺ source region 14 is formed in the top of P⁻ channel region 13.

In the conventional trench device, spaced parallel trenches, for example, trenches 20, 21 are formed into the top of the die and extend through source region 14, channel region 12, and into drift region 12. Silicon dioxide gate layers 22, 23 line the walls of trenches 20, 21 respectively and the trenches are then filled with conductive polysilicon masses 24, 25 respectively. The oxide at the bottoms of trenches 20, 21 may be thickened.

Insulation caps 30, 31 cover the conductive gate masses 24, 24 respectively, and a conductive source electrode 40 is applied to the device top surface, contacting the N⁺ source regions. In the conventional trench device, source electrode 40 also contacts the P⁻ channel diffusion 12 which reaches the device surface between source regions 14. A drain electrode 41 contacts the bottom of body 11.

In accordance with the invention, a deep trench 50 is formed between each pair of adjacent gate trenches 20, 21. The deep trench 50 is preferably deeper than gate trenches 20, 21 and its bottom is filled with a thick oxide 51. The walls of trench 50 receive a shallow boron type diffusion 52 or P type species diffusion and the trench is then filled with a boron doped conductive polysilicon mass 53. Source contact 40 contacts mass 53.

Source, drain and gate contacts S, D and G are then made to electrode 40, electrode 41 and conductive gate masses 24, 25 respectively.

The thick oxide 51 at the bottom of deep trench 50 reduces the device output capacitance. The sidewall implant 52 and P doped polysilicon 53 shield the gate trenches from the field created by a drain bias, thus reducing the gate to drain capacitance, eliminating bipolar action. Resistance to single event gate rupture and single event breakdown is also provided.

The same benefits will be obtained in an IGBT structure.

Note that the device of FIG. 1 is an N channel device. The invention is also applicable to a P channel device with the conductivity types described above reversed.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A trench MOSFET structure comprising a plurality of parallel spaced gate trenches extending through a source region of a first conductivity type, an underlying channel region of the opposite conductivity type and into a drift region of the first conductivity type; and a deep trench having a depth deeper than said gate trenches and disposed between each pair of said gate trenches; each of said deep trenches including sidewalls that receive an implant of said opposite conductivity type and a bottom surface that does not receive said implant, said deep trenches being filled with a conductive polysilicon of said opposite conductivity type; and a top contact connected to said source region and said conductive polysilicon in said deep trenches.

2. The device of claim 1, wherein said deep trenches have an insulation mass beneath said conductive polysilicon therein.

3. The device of claim 2, wherein said insulation mass comprises an oxide.

4. The device of claim 1, wherein said conductive polysilicon is, boron doped.

5. The device of claim 1, wherein said first conductivity type is N type, and said opposite conductivity type is P type.

6. The device of claim 1, wherein said drift region is grown epitaxially over a body.

7. A trench device structure comprising a plurality of parallel spaced gate trenches extending through a source region of a first conductivity type, an underlying channel region of the opposite conductivity type and into a drift region of the first conductivity type, said drift region grown epitaxially over a body; and a deep trench having a depth deeper than said gate trenches and disposed between each pair of said gate tranches; each of said deep trenches including sidewalls that receive an implant of said opposite conductivity type and a bottom surface that does not receive said implant, said deep trenches being filled with a conductive polysilicon of said opposite conductivity type; and a top contact connected to said source region and said conductive polysilicon in said deep trenches.

8. The device of claim 7, wherein said body comprises an N type body to configure the device as a MOSFET.

9. The device of claim 7, wherein said body comprises a buffer layer and a P type region to configure the device as an IGBT.

10. The device of claim 7, wherein said deep trenches have an insulation mass beneath said conductive polysilicon therein.

* * * * *